(12) United States Patent
Cho

(10) Patent No.: US 9,196,657 B2
(45) Date of Patent: Nov. 24, 2015

(54) ELECTRONIC DEVICE

(71) Applicant: SK HYNIX INC., Icheon (KR)

(72) Inventor: Kwang-Hee Cho, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/484,034

(22) Filed: Sep. 11, 2014

(65) Prior Publication Data

US 2015/0221700 A1    Aug. 6, 2015

(30) Foreign Application Priority Data

Feb. 3, 2014    (KR) .................. 10-2014-0012043

(51) Int. Cl.
*G11C 13/00* (2006.01)
*G11C 5/06* (2006.01)
*H01L 45/00* (2006.01)
*H01L 27/24* (2006.01)
*H01L 21/02* (2006.01)

(52) U.S. Cl.
CPC .......... *H01L 27/2463* (2013.01); *G11C 13/004* (2013.01); *G11C 13/0069* (2013.01); *G11C 13/0097* (2013.01); *H01L 45/122* (2013.01); *H01L 45/1253* (2013.01); *H01L 45/141* (2013.01); *H01L 45/145* (2013.01); *H01L 45/147* (2013.01); *G11C 13/0002* (2013.01); *G11C 13/003* (2013.01); *G11C 13/0007* (2013.01); *G11C 2013/005* (2013.01); *G11C 2013/009* (2013.01); *G11C 2213/71* (2013.01); *G11C 2213/77* (2013.01); *H01L 21/02417* (2013.01); *H01L 21/02568* (2013.01); *H01L 45/06* (2013.01); *H01L 45/1233* (2013.01); *H01L 45/146* (2013.01)

(58) Field of Classification Search
CPC .......... G11C 13/0002; G11C 13/0007; G11C 13/003; G11C 2213/71; G11C 2213/77; H01L 45/1233; H01L 45/146; H01L 45/06
USPC .......... 365/51, 72, 148, 163; 257/2, 3, 4, 329; 438/95
See application file for complete search history.

(56) References Cited

U.S. PATENT DOCUMENTS

| | | | |
|---|---|---|---|
| 8,023,352 B2 * | 9/2011 | Masuoka et al. | 365/210.1 |
| 2010/0219392 A1 | 9/2010 | Awaya et al. | |
| 2013/0200326 A1 * | 8/2013 | Ju et al. | 257/4 |

* cited by examiner

*Primary Examiner* — Ly D Pham

(57) ABSTRACT

An electronic device comprising a semiconductor memory unit that includes a first vertical electrode; a first variable resistance layer surrounding the first vertical electrode; a second vertical electrode surrounding the first variable resistance; a second variable resistance layer surrounding the second vertical electrode; and a plurality of horizontal electrodes contacted with an outer side of the second variable resistance layer, wherein the plurality of horizontal electrodes are spaced apart from each other in a vertical direction.

20 Claims, 8 Drawing Sheets

ELECTRONIC DEVICE

CROSS-REFERENCE TO RELATED APPLICATIONS

The present application claims priority of Korean Patent Application No. 10-2014-0012043, entitled "ELECTRONIC DEVICE" and filed on Feb. 3, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device is provided to implement a multi-level cell and increase the integration thereof.

Electronic device in accordance with embodiments of the present disclosure may reduce a sneak current during a program operation, and may obtain a sensing margin by raising a current level when a read operation is performed.

In one aspect, an electronic device is provided to include a semiconductor memory unit that includes a first vertical electrode; a first variable resistance layer surrounding the first vertical electrode; a second vertical electrode surrounding the first variable resistance; a second variable resistance layer surrounding the second vertical electrode; and a plurality of horizontal electrodes contacted with an outer side of the second variable resistance layer, wherein the plurality of horizontal electrodes are apart from each other in a vertical direction.

Implementations of the above electronic device may include one or more the following.

The first vertical electrode may include a pillar shape, and the second vertical electrode includes a ring-typed pillar shape. The plurality of horizontal electrodes, each may be contacted with a portion of the second variable resistance layer, or surround the second variable resistance layer. The plurality of horizontal electrodes may include a multi-layer structure, and the plurality of horizontal electrodes may be symmetrically disposed on a basis of the first vertical electrode and the second vertical electrode at one of the plurality of horizontal electrodes. The first variable resistance layer and the second variable resistance layer may include different materials. The first variable resistance layer and the second variable resistance layer may include a ring-typed pillar shape. The first variable resistance layer and the second variable resistance layer may include a single layer or multi-layers including one of a perovskite oxide, a transition oxide and a chalcogenide compound. A resistance state of the first variable resistance layer or the second variable resistance layer may be switched by applying a program voltage to both ends of the plurality of horizontal electrodes and the first vertical electrode or the second vertical electrode, and wherein a sum of resistance values of the first variable resistance layer and the second variable resistance layer may be sensed by applying the program voltage to the plurality of horizontal electrodes and the first vertical electrode. The first variable resistance layer may include a set voltage and a reset voltage, and data may be read by applying a read voltage ranged between the set voltage and the reset voltage to the both ends of the plurality of horizontal electrodes and the first vertical electrode. The first variable resistance layer and the second variable resistance layer include different materials, and according to the program voltage applied to both ends of the first variable resistance layer and the second variable resistance layer, the first variable resistance layer may have a high resistance state or a low resistance state, and the second variable resistance layer may have a high resistance state or a low resistance state.

The electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor. The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor. The electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system. The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system. The electronic device may further comprise a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that is part of the memory or the buffer memory in the memory system.

DETAILED DESCRIPTION

Figure 1:
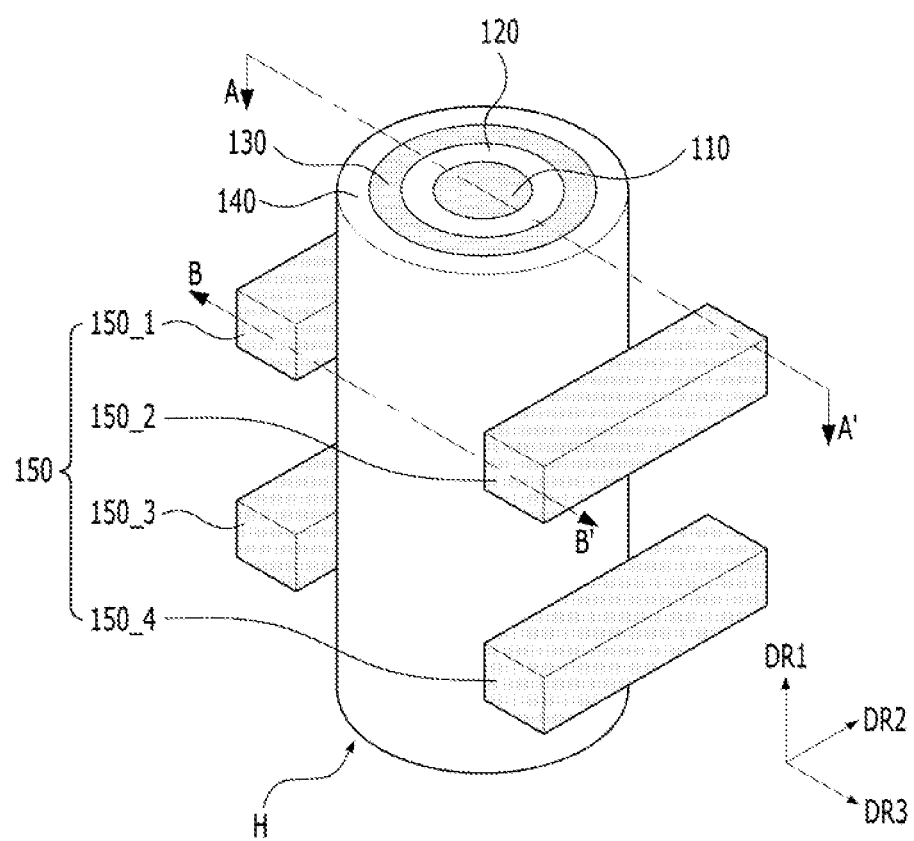
FIG. 1 is a perspective view illustrating a semiconductor memory in accordance with an exemplary implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
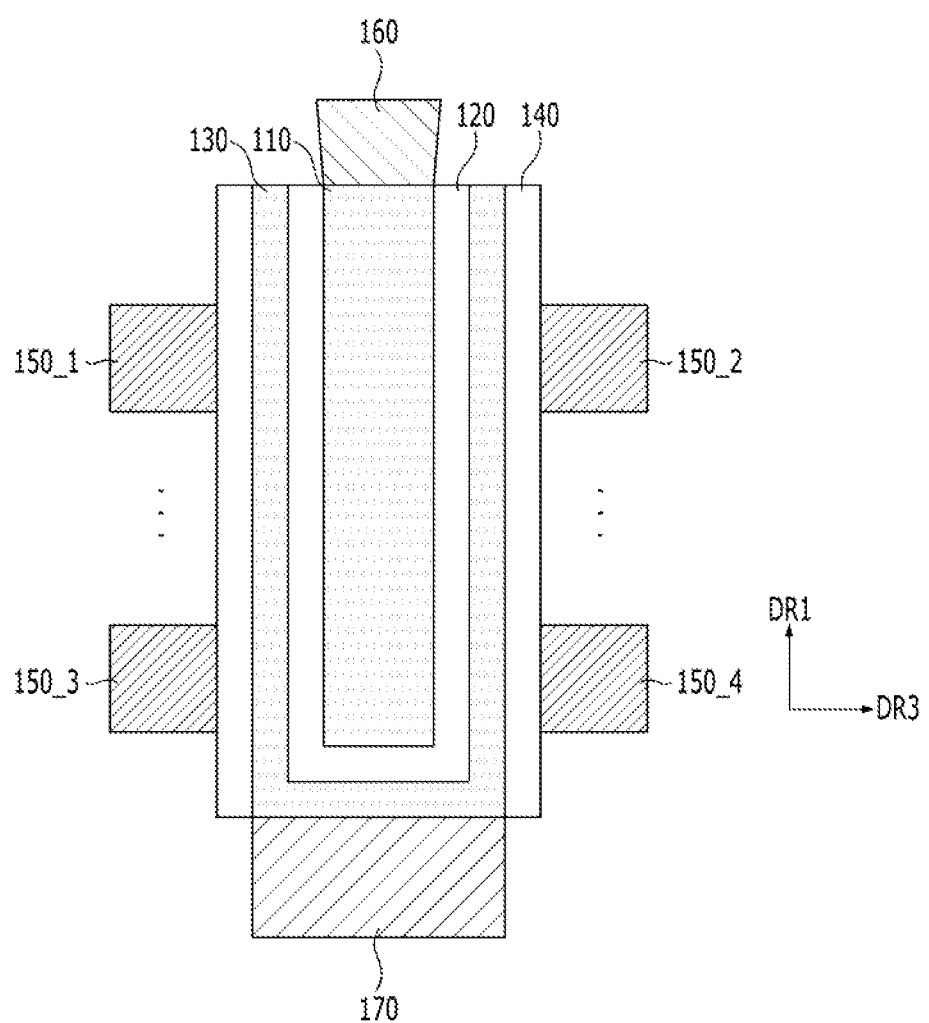
FIG. 2 is a cross-sectional view taken along A-A' line shown in FIG. 1 in accordance with an exemplary implementation of the present disclosure.
Figure 3:
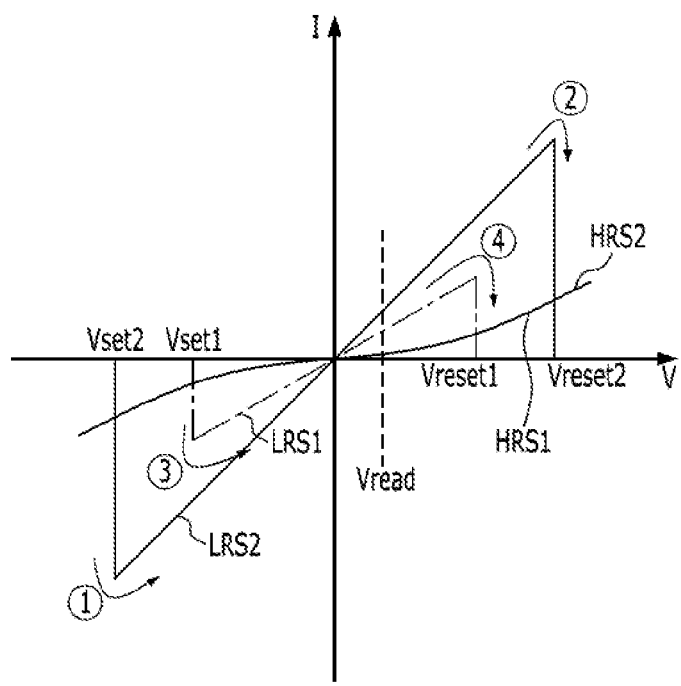
FIG. 3 is an I-V graph illustrating an operation of a variable resistance layer in accordance with an exemplary implementation of the present disclosure.

FIG. 1 is a perspective view illustrating a semiconductor memory in accordance with an implementation of the present disclosure. FIG. 2 is a cross-sectional view taken along A-A' of FIG. 1 in accordance with an implementation of the present disclosure. FIG. 3 is an I-V graph illustrating an operation of a variable resistance layer in accordance with an implementation of the present disclosure.

Referring to FIGS. 1 to 3, a semiconductor memory in accordance with an implementation of the present disclosure includes a first vertical electrode 110, a first variable resistance layer 120, a second vertical electrode 130, a second variable resistance layer 140, and a plurality of horizontal electrodes 150. The first variable resistance layer 120 surrounds the first vertical electrode 110. The second vertical electrode 130 surrounds the first variable resistance layer 120. The second variable resistance layer 140 surrounds the second vertical electrode 130. The plurality of horizontal electrodes 150 are coupled to an outer sidewall of the second variable resistance layer 140, and lower horizontal electrodes 150_3 and 150_4 are spaced apart from upper horizontal electrodes 150_1 and 150_2 in a vertical direction. More specifically, at least two of the horizontal electrodes of the plurality of horizontal electrodes 150 are spaced apart from one another along a length dimension of the second variable resistance layer 140.

More specifically, the first vertical electrode 110 may have a pillar shape that extends in a first direction DR1. The first vertical electrode 110 may have, for example, a cylindrical shape or a rectangular shape which extends in the first direction DR1. The first vertical electrode 110 may be a single layer or a multi-layer structure that includes a conductive material chosen from a metal such as Ti, Hf, Zr, Mn, Cr, Zn, Mg, Al, W and Ta, a nitride of a metal and an oxide of the metal.

The first vertical electrode 110 may be coupled to an upper contact 160.

The first variable resistance layer 120 extends in the first direction DR1 and surrounds the first vertical electrode 110. The first variable resistance layer 120 may have a circular profile such as the embodiment shown in FIG. 1, which covers an outer circumference surface of the first vertical electrode 110. For example, the first variable resistance layer 120 may have a ring pillar shape. In other embodiments, the profile of first variable resistance layer 120 may be a polygon such as a square, a rectangle, a hexagon, etc. Variable resistance layer 120 may be a layer with an even wall thickness that conforms to the shape of first vertical electrode 110.

The second vertical electrode 130 extends in the first direction DR1 and surrounds the first variable resistance layer 120. Like the first variable resistance layer 120, various embodiments of second vertical electrode 130 may have various cross-sectional profiles. For example, the second vertical electrode 130 may have a cylindrical pillar shape. The second vertical electrode 130 may be a single layer or a multi-layer structure that includes a conducting material chosen from a metal material such as Ti, Hf, Zr, Mn, Cr, Zn, Mg, Al, W and Ta, a nitride of a metal and an oxide of a metal.

The second vertical electrode 130 may be coupled to a lower contact 170.

The second variable resistance layer 140 extends in the first direction DR1, and surrounds the second vertical electrode 130. The second variable resistance layer 140 may have a cylindrical polygon profile and cover an outer surface of the second vertical electrode 130. For example, the second variable resistance layer 140 may have a ring pillar shape.

The upper contact 160 and the lower contact 170 may be coupled to a distribution line such as a bit line (not shown) or a source line (not shown).

Meanwhile, although each of the first variable resistance layer 120 and the second variable resistance layer 130 is shown as a single layer in FIGS. 1 and 2, the first variable resistance layer 120 and the second variable resistance layer 130 may be multi-layer structures each having two, three, or more layers.

The first variable resistance layer 120 and the second variable resistance layer 140 may be formed of a variable resistance material used in a variable resistance memory in which information is stored according to a change in resistance characteristics.

The variable resistance material may include various materials used in a resistive random access memory (RRAM), a phase change random access memory (PRAM), a ferroelectric random access memory (FRAM) and a magnetic random access memory (MRAM), e.g., a transition metal oxide, a metal oxide such as a perovskite material, a phase change material such as a chalcogenide material, a ferroelectric material and a ferromagnetic material.

More specifically, a resistance state of each of the first variable resistance layer 120 and the second variable resistance layer 140 is switched between a low resistance state (LRS1 and LRS2) and a high resistance state (HRS1 and HRS2), to store data. For example, if the low resistance state of the first variable resistance layer 120 and the second variable resistance layer 140 represents that binary data '1' is stored, the high resistance state of the first variable resistance layer 120 and the second resistance variable 140 may represent that binary data '0' is stored. That is, a semiconductor memory, which is switched between the low resistance state and the high resistance state, may store one bit data of '0' and '1'.

Moreover, the first variable resistance layer 120 and the second variable resistance layer 140 may include different materials, e.g., a bipolar resistance conversion material. Thus, a set voltage $V_{set1}$ of the first variable resistance layer 120 may be different from a set voltage $V_{set2}$ of the second variable resistance layer 140. Similarly, a reset voltage $V_{reset1}$ the first variable resistance layer 120 may be different from a reset voltage $V_{reset2}$ of the second variable resistance layer 140.

Referring to FIG. 3, in set operation ③, the resistance state of the first variable resistance layer 120 is switched from the first high resistance state HRS1 to the first low resistance state LRS1 and the second low resistance state LRS2. In a reset operation ④, the resistance state of the first variable resistance layer 120 is switched from the first low resistance state LRS1 to the first high resistance state HRS1.

The set operation ③ and the reset operation ④ may be performed with voltages of opposite polarity.

Moreover, a set operation ① switches the resistance state of the second variable resistance layer 140 from the second high resistance state HRS2 to the second low resistance state LRS2. A reset operation ② switches the resistance state of the second variable resistance layer 140 from the second low resistance state LRS2 to the second high resistance state HRS2.

That is, the set operation ① and the reset operation ② may be performed with voltages of opposite polarity.

As described above, since the set voltage $V_{set1}$ of the first variable resistance layer 120 is different from the set voltage $V_{set2}$ of the second variable resistance layer 140, and the reset voltage $V_{reset1}$ the first variable resistance layer 120 is different from the reset voltage $V_{reset2}$ of the second variable resistance layer 140, the resistance state of each of a plurality of variable resistance layers may be adjusted independent of one another using different voltages.

Figure 5:
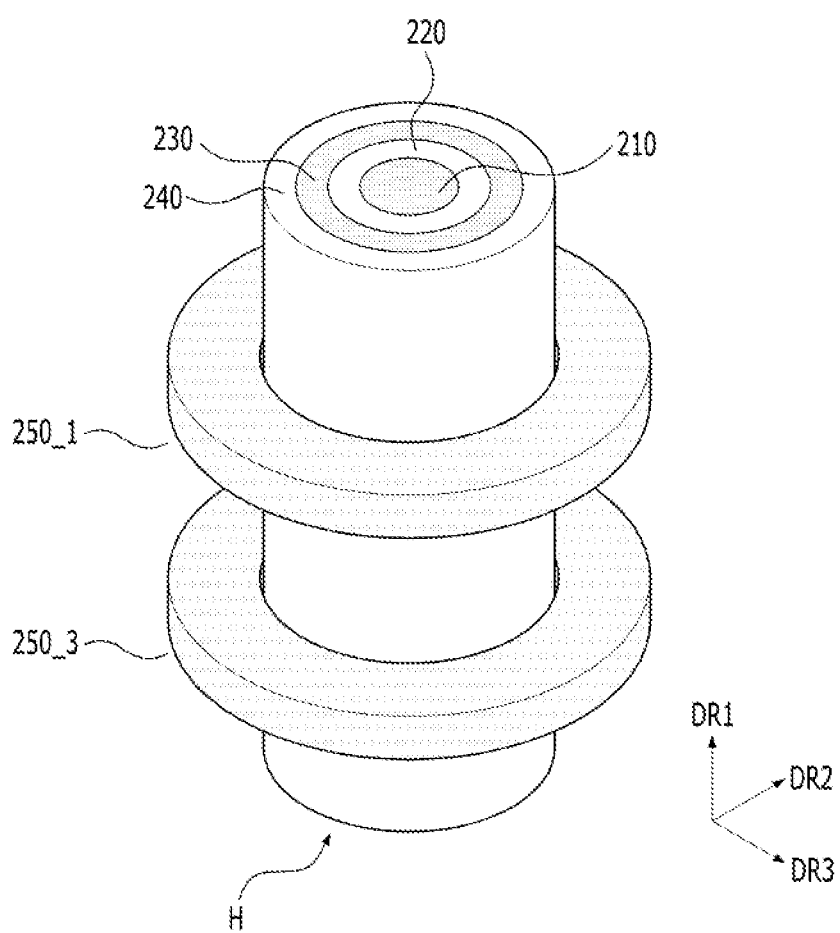
FIG. 5 is a perspective view illustrating a semiconductor memory in accordance with an exemplary implementation of the present disclosure.

Each of the plurality of horizontal electrodes 150 may extend in the second direction DR2, and be in contact with a portion of the second variable resistance layer 140 (referring to FIG. 1), or surround the second variable resistance layer 140 (referring to electrode 250_1 and electrode 250_3 of FIG. 5).

The plurality of horizontal electrodes 150 have a multi-layer structure, and a pair of horizontal electrodes among the plurality of horizontal electrodes 150 may be disposed symmetrically about the first vertical electrode 110 and the second vertical electrode 130. For example, a first horizontal electrode 150_1 and a second horizontal electrode 150_2 are symmetrically disposed about axes of symmetry of the first vertical electrode 110 and the second vertical electrode 130. Similarly, a third horizontal electrode 150_3 and a fourth horizontal electrode 150_4 may be symmetrically disposed about the first vertical electrode 110 and the second vertical electrode 130. Each of the plurality of horizontal electrodes 150 may be a single layer a single layer structure or a multi-layer structure including a conducting material that includes a metal chosen from Ti, Hf, Zr, Mn, Cr, Zn, Mg, Al, W and Ta, a nitride of a metal and an oxide of a metal.

The plurality of horizontal electrodes 150 may transmit an electric signal, e.g., a program current for programming data and a read current for reading data, to the first variable resistance layer 120 and the second variable resistance layer 140. The plurality of horizontal electrodes 150 may be coupled to a global word line (not shown).

As described above, the first variable resistance layer 120 is disposed between the first vertical electrode 110 and the second vertical electrode 130, and the second variable resistance layer 140 is disposed between the second vertical electrode 130 and a horizontal electrode 150. Herein, when a voltage is simultaneously applied to the horizontal electrode 150 and the first vertical electrode 110, the second vertical electrode 130 is shared. In other words, the vertical electrode 130 is in an electrical path between the horizontal electrode 150 and the first vertical electrode 110. Thus, when a voltage between a horizontal electrode 150 and first variable electrode 110 is applied to the first variable resistance layer 120, the same voltage is applied to the second variable resistance layer 140.

Since a plurality of data is stored according to a combination of the high resistance state HRS or the low resistance state LRS of the first variable resistance layer 120 and the second variable resistance layer 140, a multi-level cell may be implemented.

Hereinafter, an operation of the memory cell in accordance with implementations of the present disclosure will be described.

Figure 4:
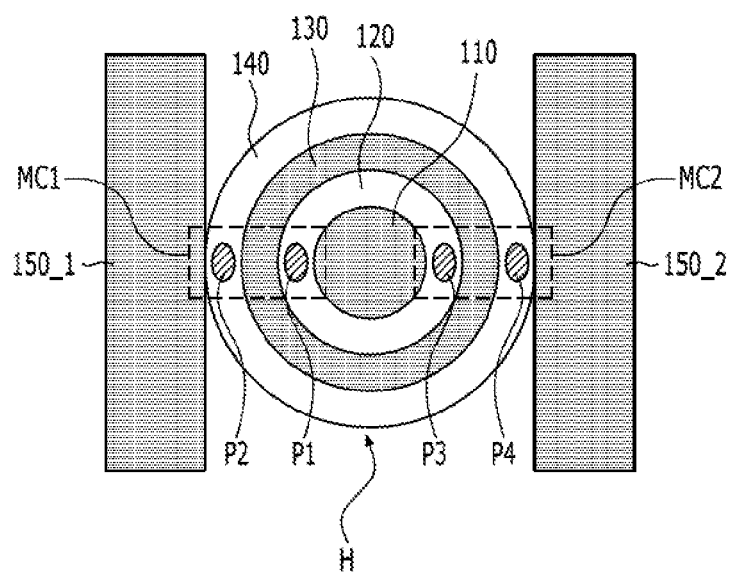
FIG. 4 is a plane view taken along B-B' line shown in FIG. 1 in accordance with an exemplary implementation of the present disclosure.

FIG. 4 is a plan view taken along B-B' line of FIG. 1 in accordance with an implementation of the present disclosure.

Referring to FIG. 4, memory cells MC1 and MC2 include the first vertical electrode 110, the second vertical electrode 120, the first horizontal electrode 150_1 and the second horizontal electrode 150_2, respectively.

More specifically, the first memory cell MC1 is formed between the first vertical electrode 110 and the first horizontal electrode 150_1. The second memory cell MC2 is formed between the first vertical electrode 110 and the second horizontal electrode 150_2. The first memory cell MC1 may include a first program region P1 and a second program region P2 in which data are programmed in the first variable resistance layer 120 and the second variable resistance layer 140, respectively. The second memory cell MC2 may include a third program region P3 and a fourth program region P4 on which are data are programmed in the first variable resistance layer 120 and the second variable resistance layer 140, respectively. Herein, '0' and '1' data having one bit are stored in the first to fourth program regions P1 to P4 by switching between the high resistance state HRS and the low resistance state LRS through a set operation or a reset operation.

More specifically, if an electrical signal is applied between the first vertical electrode 110 and the first horizontal electrode 150_1, the resistance state of the first program region P1 and the second program region P2 may be changed. That is, the data of memory cell MC1 may be stored in the first program region P1 and the second program region P2. If the electrical signal is applied to the first vertical electrode 110 and the second horizontal electrode 150_2, the resistance state of the third program region P1 and the fourth program region P4 may be changed. That is, data of memory cell MC2 may be stored in the third program region P3 and the fourth program region P4.

In summary, the first variable resistance layer 120 and the second variable resistance layer 140 may include the program regions P1 to P4. The data may be programmed or read on each of the first to fourth program regions P1 to P4. If the third horizontal electrode 150_3 and the fourth horizontal electrode 150_4 are additionally present, more program regions may be obtained.

A memory cell in accordance with embodiments of the present disclosure may be switched between first to fourth states according to a voltage condition. In the first state, the first variable resistance layer 120 has first high resistance state HRS1 and the second variable resistance layer 140 has second high resistance state HRS2. In the second state, the first variable resistance layer 120 has first high resistance state HRS1 and the second variable resistance layer 140 has second low resistance state LRS2. In the third state, the first variable resistance layer 120 has first low resistance state LRS1 and the second variable resistance layer 140 has second high resistance state HRS2. In the fourth state, the first variable resistance layer 120 has first low resistance state LRS1 and the second variable resistance layer 140 has second low resistance state LRS2.

Thus, since the first state, the second state, the third state and the fourth state may represent binary data '00', '01', '10' and '11', respectively, two bits of data may be stored in each memory cell MC1 and MC2.

The semiconductor memory in accordance with embodiments of the present disclosure may operate in a multi-bit manner or a single-bit manner.

Hereinafter, a program operation and a read operation of a memory cell operating in a multi-bit manner in accordance with embodiments of the present disclosure will be described. The embodiments will be described with reference to the first memory cell MC1.

First, the first program region P1 may be programmed by supplying a program voltage between the first horizontal electrode 150_1 and the first vertical electrode 110. The first program region P2 may be programmed by supplying a program voltage between the first horizontal electrode 150_1 and the second vertical electrode 130.

Specifically, the first program region P1 and the second program region P2 of the first memory cell MC1 may be programmed to change the resistance state of the first variable resistance layer 120 and the second variable resistance layer 140, respectively. The resistance state of the second variable resistance layer 140 is switched to program the second program region P2 by supplying a set voltage $V_{set}$ or a reset voltage $V_{reset}$ to the first horizontal electrode 150_1 and the second vertical electrode 130 and switching the resistance state of the second variable resistance layer 140.

For example, consider an embodiment in which the second variable resistance layer 140 has the second high resistance state HRS2. In such an embodiment, binary data '0' may be stored in the second program region P2. Then, if a negative program voltage is applied between the second vertical electrode 130 and the first horizontal electrode 150_1, when the program voltage reaches the second set voltage $V_{set2}$, as seen in FIG. 3, set operation ① is performed by switching the second variable resistance layer 140 from the second high resistance state HRS2 to the second low resistance state LRS2. In such an embodiment, binary data '1' may be stored in the second program region P2.

Subsequently, if a positive program voltage is supplied to the second vertical electrode 130 and the first horizontal electrode 150_1, when the program voltage reaches the second reset voltage $V_{reset2}$ as seen in FIG. 3, reset operation ② is performed by switching the second variable resistance layer 140 from the second low resistance state LRS2 to the second high resistance state HRS2. In such an embodiment, binary data '0' may be stored in the second program region P2. The resistance state of the second program region P2 may be switched by applying set voltage $V_{set}$ or the reset voltage $V_{reset}$ to the second vertical electrode 130 and the first horizontal electrode 150_1.

The resistance state of the first variable resistance layer 120 is switched to program the first program region P1. That is, the resistance state of the first variable resistance layer 120 is switched by applying a set voltage $V_{set}$ or a reset voltage $V_{reset}$ to the first horizontal electrode 150_1 and the first vertical electrode 110. When programming the first program region P1, the second vertical electrode 130 has a floating state.

More specifically, in an embodiment, the first variable resistance layer 120 has the first high resistance state HRS1. In such an embodiment, the binary data '0' may be stored in the first program region P1. Subsequently, if a program voltage is applied to the first vertical electrode 110 and the first horizontal electrode 150_1, when the program voltage reaches the first set voltage $V_{set1}$ as seen in FIG. 3, the set operation ③ is performed by switching the first variable resistance layer 120 from the first high resistance state HRS1 to the first low resistance state LRS1. In such an embodiment, binary data '1' may be stored in the second program region P2.

Subsequently, if a negative program voltage is applied to the second vertical electrode 130 and the first horizontal electrode 150_1 when the program voltage reaches the second reset voltage $V_{reset2}$ as seen in FIG. 3, reset operation ④ is performed by switching the second variable resistance layer 140 from the second low resistance state LRS2 to the second high resistance state HRS2. In such an embodiment, binary data '0' may be stored in the second program region P2.

Furthermore, if a negative voltage less than the second set voltage or a positive voltage larger than the second reset voltage $V_{reset2}$, are applied to the second vertical electrode 130 and the first horizontal electrode 150_1, the data of second program region P2 may be switched. In addition, when a positive voltage between $V_{reset1}$ and $V_{reset2}$ is applied across first vertical electrode 110 and first horizontal electrode 150_1, the voltage extends across both of the first and second program regions P1 and P2. However, because the voltage is less than $V_{reset2}$, such an operation will change the resistance state of first program region P2, but it will not change the resistance state of second program region P1. Similarly, applying a voltage between $V_{set1}$ and $V_{set2}$ across first vertical electrode 110 and first horizontal electrode 150_1 can change the resistance state of first program region P1 from HRS1 to LRS1 without changing the resistance state of second program region P2.

Accordingly, in an embodiment, memory cell MC1 is programmed to have two bits of data. The first program region P1 and the second program region P2 may be programmed individually by applying a different set voltage $V_{set}$ or a different reset voltage $V_{reset}$.

A multi-bit read operation in accordance with an embodiment of the present disclosure will now be described.

Data stored in the first program region P1 and the second program region P2 of the memory cell MC1 is read by applying a read voltage between the first horizontal electrode 150_1 and the first vertical electrode 110, and sensing a sum of resistance values of the first variable resistance layer 120 and the second variable resistance layer 140.

More specifically, a read operation is performed by applying a read voltage in a range between the first set voltage $V_{set1}$ and the first reset voltage $V_{reset1}$ between the first variable resistance layer 120 and the second variable resistance layer 140.

For example, in a read operation, the first resistance state HRS1 or LRS1 of the first variable resistance layer 120 and the second resistance state HRS2 or LRS2 of the second variable resistance layer 140 are determined by applying a positive voltage that is less than the first reset voltage between the first horizontal electrode 150_1 and the first vertical electrode 110, and by detecting a detection current $I_{read}$. The first to fourth states of the memory cell MC1 may be determined by analyzing the detected result, which is a combination of the resistance values of first and second program regions P1 and P2. Since the read voltage is in a range between the first set voltage $V_{set1}$ and the first reset voltage $V_{reset1}$, the resistance states of the first variable resistance layer 120 and the second variable resistance layer 140 are not switched by a read operation.

More specifically, in the first state, the first variable resistance layer 120 has the first high resistance state HRS1 and the second variable resistance layer 140 has the second high resistance state HRS2. In the second state, the first variable resistance layer 120 has the first high resistance state HRS1 and the second variable resistance layer 140 has the second low resistance state LRS2. In the third state, the first variable resistance layer 120 has the first low resistance state LRS1 and the second variable resistance layer 140 has the second high resistance state HRS2. In the fourth state, the first variable resistance layer 120 has the first low resistance state LRS1 and the second variable resistance layer 140 has the second low resistance state LRS2.

The data of the first program region P1 and the second program region P2 may be determined by detecting a combined resistance value of the first variable resistance layer 120 and the second variable resistance layer 140. In an embodiment, the four states of resistance are sequentially ordered, e.g., the first state has a higher resistance than the second state which has a higher resistance than the third state which has a higher resistance than the fourth state. Thus, two bits of data stored in the memory cell may be determined in a single read operation.

Next, a single-bit program operation and read operation of a memory cell in accordance with embodiments of the present disclosure will be described. The embodiments will be described with reference to the first memory cell MC1.

First, a single-bit program operation in accordance with embodiments of the present disclosure will be described.

The first variable resistance layer 120 and the second variable resistance layer 140 may be switched to have a same resistance state by applying a program voltage to the first horizontal electrode 150_1 and the first vertical electrode 110. Thus, the same data are programmed in the first program region P1 and the second program region P2. The first variable resistance layer 120 may have the same material as the second variable resistance layer 140.

The first program region P1 may be programmed by applying a voltage between the first horizontal electrode 150_1 and the second vertical electrode 130. The second program region P2 may be programmed by applying a voltage between the first horizontal electrode 150_1 and the first vertical electrode 110. Thus, in an embodiment, program regions P1 and P2 may be programmed to have different resistance states from one another even when they switch at the same threshold voltages.

The semiconductor memory using a single bit program operation in accordance with embodiments of the present disclosure may reduce a sneak current by increasing a resistance of a memory cell when a program operation is performed through the horizontal electrode 150 and the first vertical electrode 110.

A single bit read operation in accordance with embodiments of the present disclosure will now be described.

The data of the first program region P1 or the second program region P2 is read by detecting a resistance value of one of the first variable resistance layer 120 and the second variable resistance layer 140.

For example, the resistance value of the second variable resistance layer 140 is detected by applying the read voltage $V_{read}$ to the first horizontal electrode 150_1 and the second vertical electrode 130, and the resistance value of the first variable resistance layer 120 is detected by applying the read voltage $V_{read}$ to the first horizontal electrode 150_1 and the first vertical electrode 110. Thus, the data stored in the first program region P1 and the second program region P2 may be read when the first variable resistance layer 120 and the second variable resistance layer 140 included in the first memory cell MC1 have same resistance states, e.g., the high resistance sate HRS or the low resistance state LRS. As discussed above, when a read voltage $V_{read}$ is applied between the first horizontal electrode 150_1 and the first vertical electrode 110, the resistance value is the sum of the resistance values of vertical resistance layer 120 and vertical resistance layer 140. Thus, a resistance value for vertical resistance layer 140 can be determined from such a read operation.

As described above, since the read voltage $V_{read}$ is applied to the first variable resistance layer 120 and the second variable resistance layer 140, a detection current $I_{read}$ having a small resistance value may be detected. Thus, a sensing margin may be adjusted by increasing a current level during the read operation.

Hereinafter, a semiconductor memory in accordance with an implementation of the present disclosure will be described.

FIG. 5 is a perspective view illustrating a semiconductor memory device in accordance with an implementation of the present disclosure.

Referring to FIG. 5, the semiconductor memory includes a first vertical electrode 210, a first variable resistance layer 220, a second vertical electrode 230, a second variable resistance layer 240 and a plurality of horizontal electrodes 250. Since the first vertical electrode 210, the first variable resistance layer 220, the second vertical electrode 230 and the second variable resistance layer 240 may have same configuration as the first vertical electrode 110, the first variable resistance layer 120, the second vertical electrode 130 and the second variable resistance layer 140 shown in FIG. 1, detailed descriptions of the first vertical electrode 210, the first variable resistance layer 220, the second vertical electrode 230 and the second variable resistance layer 240 will not be repeated here.

The first variable resistance layer 220 and the second variable resistance layer 240 may have a same material. In another implementation of the present disclosure, the first variable resistance layer 220 and the second variable resistance layer 240 may have different materials. Moreover, in another implementation of the present disclosure, one memory cell MC may be included in one variable resistance layer including one horizontal electrode.

The plurality of horizontal electrodes 250 may be extend in a second direction DR2 or a third direction DR3, and may be coupled to the second variable resistance layer 240. The plurality of horizontal electrodes 250 may be in contact with a pillar H to surround the second variable resistance layer 240. In another implementation, the plurality of horizontal electrodes 250 surrounding the same pillar H may be stacked to be spaced apart from each other along the central axis of the pillar.

A multi-bit program operation in accordance with an implementation of the present disclosure will be described as below.

The resistance state of the second variable resistance layer 240 is switched by applying a program voltage between the second vertical electrode 230 and the first horizontal electrode 250_1, and the resistance state of the first variable resistance layer 220 is switched by applying a program voltage between the first vertical electrode 210 and the first horizontal electrode 250_1. Thus, data may be programmed in both of the variable resistance layers 220 and 240.

More specifically, in order to switch the second variable resistance layer 240, set voltage $V_{set2}$ or reset voltage $V_{reset2}$ are applied between the second vertical electrode 230 and the first horizontal electrode 250_1. In order to program the first variable resistance layer 220, the resistance state of the first variable resistance layer 120 is switched by applying the set voltage $V_{set1}$ or the reset voltage $V_{set1}$ between the first vertical electrode 220 and the first horizontal electrode 250_1. The second vertical electrode 230 may be in a floating state during this operation.

A multi-bit read operation in accordance with an implementation of the present disclosure will be described.

The data of the memory cell is determined by applying a read voltage between the first horizontal electrode 250_1 and the first vertical electrode 210, and sensing a sum of the resistance value of the first variable resistance layer 220 and the second variable resistance layer 240. More specifically, the read operation may be performed by applying a read voltage in a range between the first set voltage $V_{set1}$ and the first reset voltage $V_{reset1}$ between the first variable resistance layer 220 and the second variable resistance layer 240. Since the multi-bit read operation used to read data for the embodiment of FIG. 5 is same as the multi-bit read operation discussed above with respect to FIG. 3, detailed descriptions will not be repeated.

A single-bit program operation in accordance with an implementation of the present disclosure will now be described.

The first variable resistance layer 220 and the second variable resistance layer 240 may be switched to have a same resistance level through the plurality of horizontal electrodes 250 and the first vertical electrode 210.

More specifically, the first variable resistance layer 220 and the second variable resistance layer 240 may be switched to have a same resistance level by applying a voltage between one or more horizontal electrode 250 and first vertical electrode 210. For example, when the variable resistance layers 220 and 240 have different set and reset voltages, both of the layers may be switched to each have a high resistance level even though the specific resistance states are different (HRS1 and HRS2). In an embodiment in which variable resistance layers 220 and 240 have the same material, they may be switched to have the same resistance state.

A single-bit read operation in accordance with an implementation of the present disclosure will be described as below.

The data stored in a memory cell may be read by detecting a resistance state of the first variable resistance layer 220 and the second variable resistance layer 240.

For example, the detection current $I_{read}$ of the second variable resistance layer 240 may be detected by applying the read voltage $V_{read}$ between the second vertical electrode 230 and the horizontal electrode 250. The detection current $I_{read}$ of the first variable resistance layer 220 may be detected by applying the read voltage $V_{read}$ between the first vertical electrode 210 and the horizontal electrode 250. In such an operation, the second vertical electrode 230 may be in a floating state. Thus, the data stored in the memory cell may be read by detecting the resistance of one of the first variable resistance layer 220 and the second variable resistance layer 240.

The single-bit program operation described above may have merits as described below.

A program operation may be performed by applying a program voltage to the plurality of horizontal electrodes 250 and the first vertical electrode 210, and applying the program voltage to the first variable resistance layer 220 and the second variable resistance layer 240. The resistance of the memory cell MC may be increased by using the resistance of the first variable resistance layer 220 and the second variable resistance layer 240. Thus, a sneak current through a memory cell having a low resistance state may be reduced. Moreover, during the read operation, the data stored in the memory cell may be read by applying the read voltage to one or both of the first variable resistance layer 220 and the second variable resistance layer 240. A sensing margin may be increased by increasing a current level during the read operation.

In implementations described above, a structure having two variable resistance layers which are disposed among three electrodes is described. In other embodiments, a plurality of memory cells having a plurality of variable resistance layers which are disposed among a plurality of electrodes may be implemented.

Furthermore, a plurality of variable resistance layers, which are disposed among three electrodes, may be individually controlled. Thus, one selector-one resistor (1S1R) structure may be configured by using one of two electrodes as a selection element.

In accordance with implementations of the present disclosure, a plurality of multi-cells may be implemented. Accordingly, embodiments provide a semiconductor memory having an increased integration. Moreover, when a single-bit implementation is used, a sneak current may be reduced and a sensing margin may be improved.

The above and other memory circuits or semiconductor devices based on the disclosed technology may be used in a range of devices or systems. FIGS. 6-10 provide some examples of devices or systems that may implement the memory circuits disclosed herein.

Figure 6:
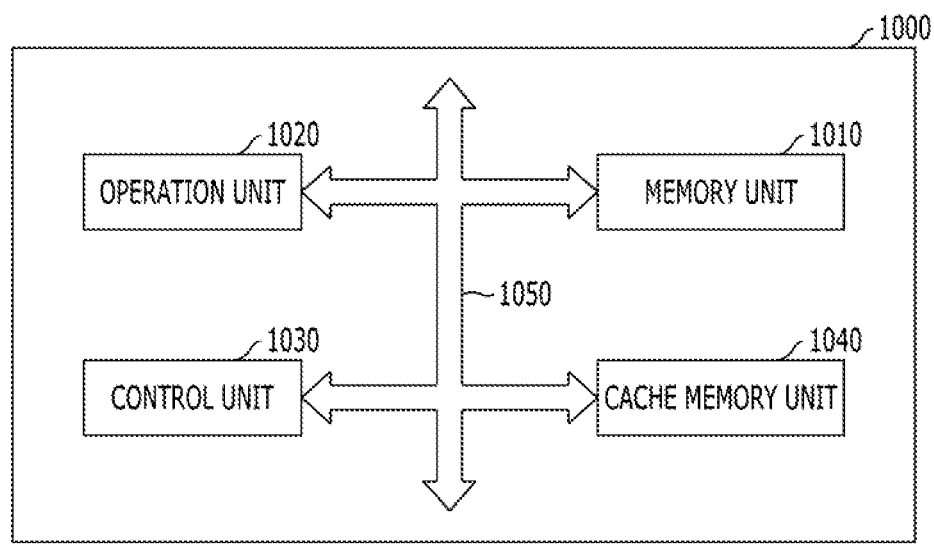
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first vertical electrode, a first variable resistance layer surrounding the first vertical electrode, a second vertical electrode surrounding the first variable resistance layer, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the memory unit 1010 is increased. As a result, a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
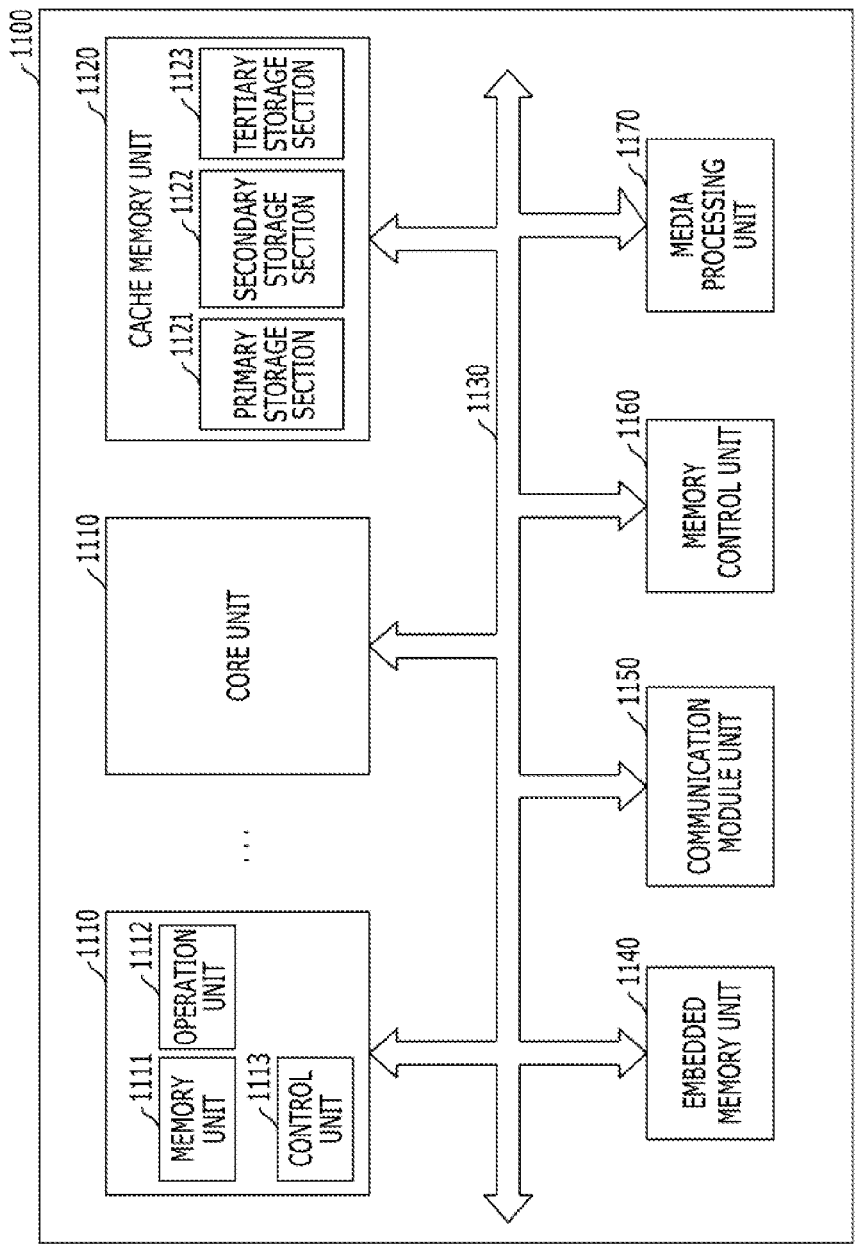
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first vertical electrode, a first variable resistance layer surrounding the first vertical electrode, a second vertical electrode surrounding the first variable resistance layer, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the cache memory unit 1120 is increased. As a result, a size of the processor 1100 may be reduced.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
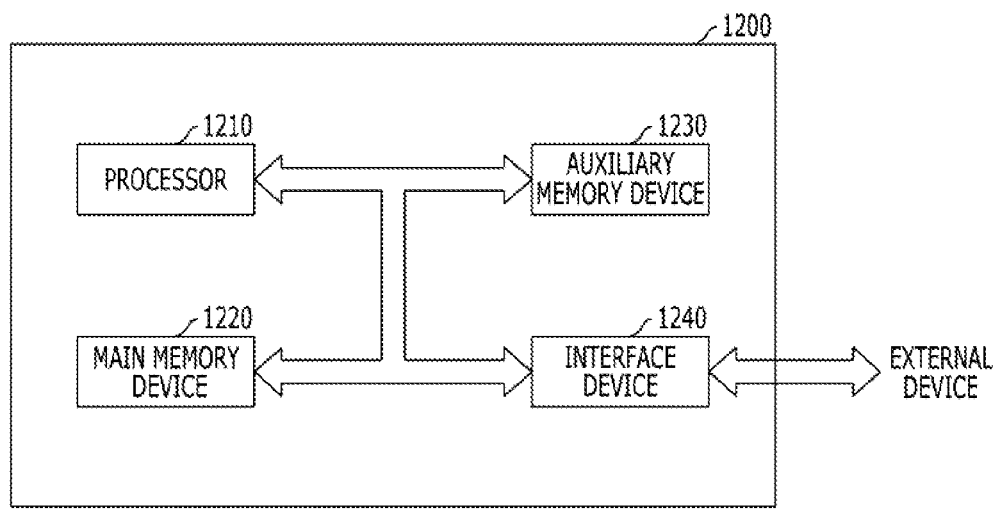
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first vertical electrode, a first variable resistance layer surrounding the first vertical electrode, a second vertical electrode surrounding the first vertical electrode, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the main memory device 1220 is increased. As a result, a size of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first vertical electrode, a first variable resistance layer surrounding the first vertical electrode, a second vertical electrode surrounding the first variable resistance layer, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the auxiliary memory device 1230 is increased. As a consequence, a size of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
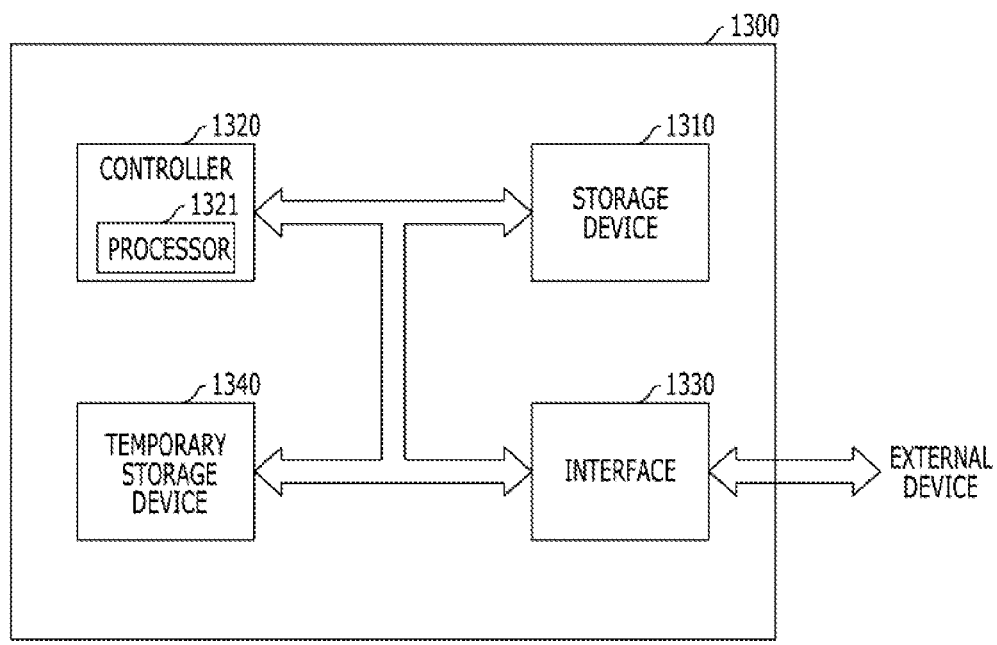
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a first vertical electrode, a first variable resistance layer surrounding the first vertical electrode, a second vertical electrode surrounding the first variable resistance layer, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the temporary storage device 1340 is increased. As a result, a size of the data storage system 1300 may be reduced.

Figure 10:
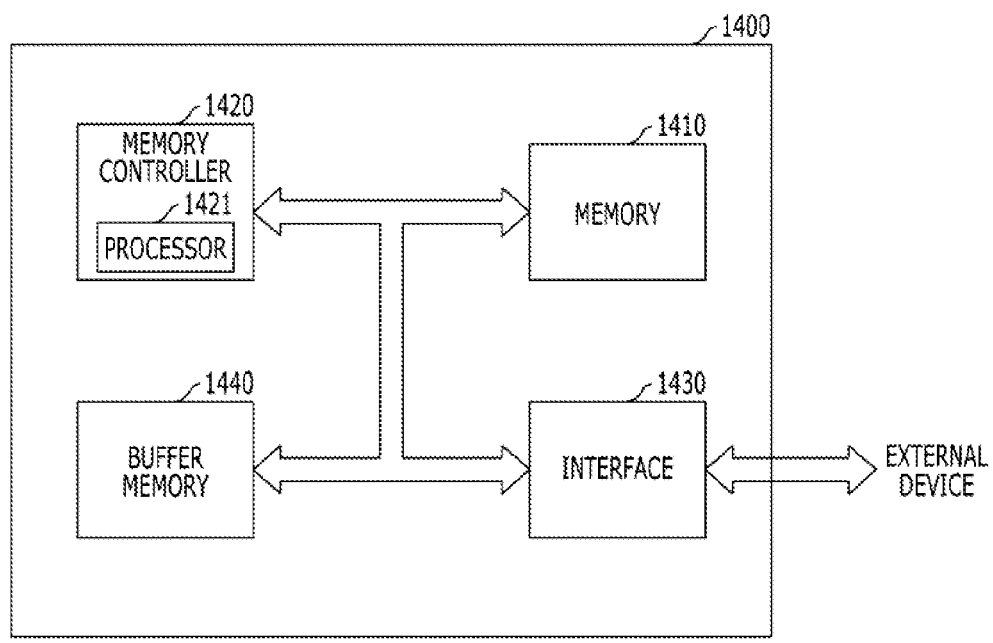
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first vertical electrode, a first variable resistance layer surrounding the first vertical electrode, a second vertical electrode surrounding the first variable resistance layer, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the memory 1410 is increased. As a consequence, a size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first vertical electrode, a first variable resistance layer surrounding the first vertical electrode, a second vertical electrode surrounding the first variable resistance layer, a second variable resistance layer surrounding the second vertical electrode, and a plurality of horizontal electrodes, which are contacted with an outer circumference of the second variable resistance layer and are apart from each other. Thus, a multi-level cell may be implemented. Through this, the integration of the buffer memory 1440 is increased. As a consequence, a size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

By the electronic device according to the implementations of the present disclosure described above, the switching characteristic of a resistance variable element may be improved by controlling the relative width of a pinned magnetic layer to a condition where a total sum of the horizontal component and the vertical component of a stray magnetic field influencing a free magnetic layer is minimized.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that comprises:
   a first vertical electrode;
   a first variable resistance layer surrounding the first vertical electrode;
   a second vertical electrode surrounding the first variable resistance layer;
   a second variable resistance layer surrounding the second vertical electrode; and
   a plurality of horizontal electrodes coupled to an outer sidewall of the second variable resistance layer, wherein at least two of the plurality of horizontal electrodes are spaced apart from each other along a length of the second variable resistance layer.

2. The electronic device according to claim 1, wherein the first vertical electrode has a pillar shape, and the second vertical electrode has a hollow pillar shape.

3. The electronic device according to claim 1, wherein each of the plurality of horizontal electrodes surrounds the second variable resistance layer.

4. The electronic device according to claim 1, wherein the plurality of horizontal electrodes has a multi-layer structure, and the plurality of horizontal electrodes are arranged symmetrically—with respect to the first vertical electrode and the second vertical electrode.

5. The electronic device according to claim 1, wherein the first variable resistance layer includes materials that are not present in the second variable resistance layer.

6. The electronic device according to claim 1, wherein the first variable resistance layer and the second variable resistance layer are hollow cylindrical pillars.

7. The electronic device according to claim 1, wherein the first variable resistance layer and the second variable resistance layer include a material chosen from a perovskite oxide, a transition oxide and a chalcogenide compound.

8. The electronic device according to claim 1, wherein a resistance state of the first variable resistance layer or the second variable resistance layer is switched by applying a program voltage between one of the plurality of horizontal electrodes and the first vertical electrode or the second vertical electrode, and
   wherein a sum of resistance values of the first variable resistance layer and the second variable resistance layer is sensed by applying a read voltage between the one of the plurality of horizontal electrodes and the first vertical electrode.

9. The electronic device according to claim 8, wherein the first variable resistance layer is programmed by a set voltage and a reset voltage, and data is read by applying a read voltage between the one of the plurality of horizontal electrodes and the first vertical electrode, and
   wherein a voltage level of the read voltage is between the set voltage and the reset voltage.

10. The electronic device according to claim 8, wherein the first variable resistance layer and the second variable resistance layer include different materials, and
    wherein the first variable resistance layer has a high resistance state or a low resistance state according to the program voltage applied between the first variable resistance layer and the second variable resistance layer, and the second variable resistance layer has the high resistance state or the low resistance state.

11. The electronic device according to claim 1, wherein the first variable resistance layer and the second variable resistance layer are switched to have a same resistance state by applying a program voltage between one of the plurality of horizontal electrodes and the first vertical electrode, and
    wherein a resistance value of the first variable resistance layer or the second variable resistance layer is detected in a read operation.

12. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

13. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that is part of the cache memory unit in the processor.

14. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory unit is part of the auxiliary memory device or the main memory device in the processing system.

15. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit is part of the storage device or the temporary storage device in the data storage system.

16. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory unit that is part of the memory or the buffer memory in the memory system.

17. The electronic device according to claim 1, further comprising:
   a first contact coupled to the first vertical electrode; and
   a second contact coupled to the second vertical electrode.

18. The electronic device according to claim 1, wherein the first variable resistance layer has a first threshold switching value, and the second variable resistance layer has a second threshold switching value higher than the first threshold switching value.

19. The electronic device according to claim 1, wherein the first variable resistance layer has a first threshold switching value, and the second variable resistance layer has the first threshold switching value.

20. The electronic device according to claim 1, wherein the first vertical electrode, the first variable resistance layer, the second vertical electrode, and the second variable resistance layer define a memory cell that stores a first bit of data in the first variable resistance layer and stores a second bit of data in the second variable resistance layer.

* * * * *